US011085950B2

(12) United States Patent
Dau et al.

(10) Patent No.: US 11,085,950 B2
(45) Date of Patent: Aug. 10, 2021

(54) INTERFACE APPARATUS FOR SEMICONDUCTOR TESTING

(71) Applicant: Spire Manufacturing, Inc., Fremont, CA (US)

(72) Inventors: Hai Dau, San Ramon, CA (US); Lim Hooi Weng, Singapore (SG); Kothandan Shanmugam, Singapore (SG); Christine Bui, Gilroy, CA (US)

(73) Assignee: Spire Manufacturing, Fremont, CA (US)

( * ) Notice: Subject to any disclaimer, the term of this patent is extended or adjusted under 35 U.S.C. 154(b) by 0 days.

(21) Appl. No.: 16/223,303

(22) Filed: Dec. 18, 2018

(65) Prior Publication Data

US 2019/0257858 A1    Aug. 22, 2019

Related U.S. Application Data

(63) Continuation-in-part of application No. 15/980,748, filed on May 16, 2018, now abandoned, which is a continuation-in-part of application No. 14/864,823, filed on Sep. 24, 2015, now Pat. No. 10,096,958.

(51) Int. Cl.

| *G01R 1/073* | (2006.01) |
|---|---|
| *H01R 12/52* | (2011.01) |
| *G01R 31/28* | (2006.01) |
| *G01R 3/00* | (2006.01) |

(52) U.S. Cl.
CPC ........... *G01R 1/07378* (2013.01); *G01R 3/00* (2013.01); *G01R 31/2831* (2013.01); *G01R 31/2834* (2013.01); *H01R 12/52* (2013.01)

(58) Field of Classification Search
CPC .............. G01R 1/07378; G01R 1/0491; G01R 31/2834; G01R 31/2831; G01R 3/00
See application file for complete search history.

(56) References Cited

U.S. PATENT DOCUMENTS

| 6,876,216 | B2 * | 4/2005 | Fu-Chin | G01R 1/07378 |
| | | | | 324/754.07 |
| 2012/0146679 | A1 * | 6/2012 | Chang | G01R 1/07378 |
| | | | | 324/756.03 |
| 2013/0069683 | A1 * | 3/2013 | Kuo | H05K 3/00 |
| | | | | 324/755.03 |
| 2015/0033553 | A1 * | 2/2015 | Wu | G01R 31/2889 |
| | | | | 29/831 |
| 2016/0131700 | A1 * | 5/2016 | Kang | G01R 31/2891 |
| | | | | 324/750.01 |

* cited by examiner

*Primary Examiner* — Dominic E Hawkins
(74) *Attorney, Agent, or Firm* — Mark Gonzales

(57) ABSTRACT

In one embodiment, the present invention includes an interface assembly for a vertical probe contactor. The interface assembly comprises a base board, a mounting board, a depth adjust plate, and an interface apparatus. The depth adjust plate is between the base board and the mounting board, and the interface apparatus is mounted to the mounting board. The interface apparatus is configured to receive the vertical probe contactor through an opening in the base board and a corresponding opening in the depth adjust plate. A thickness of the depth adjust plate defines a vertical distance between a wafer side of the base board and a plurality of probe tips of the vertical probe contactor.

18 Claims, 12 Drawing Sheets

200

201 — drilling a first plurality of apertures through a first housing substrate

202 — drilling a second plurality of apertures through a second housing substrate 203 — aligning the first housing substrate to the second housing substrate 204 — placing temporary spacers between the first and second housing substrates 205 — passing a plurality of wires through the first and second plurality of apertures 206 — Attaching the first housing substrate to the second housing substrate 207 — cutting the wire ends of the plurality of wires protruding out from the first and second housing substrates 208 — lapping the wire ends 209 — plating the wire ends

Fig. 2

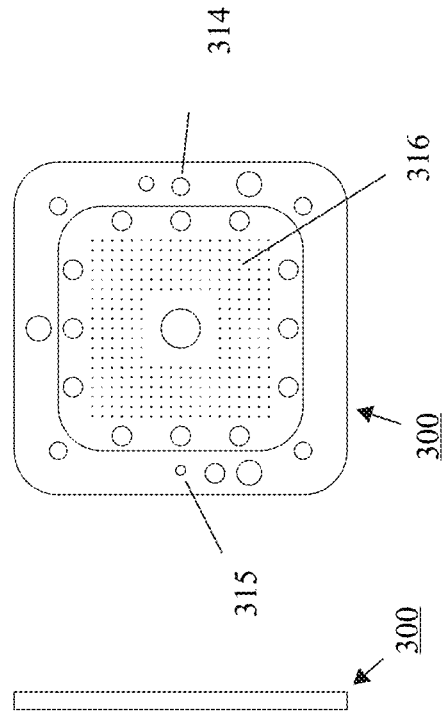
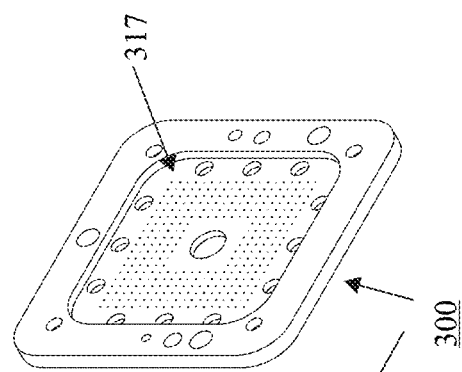
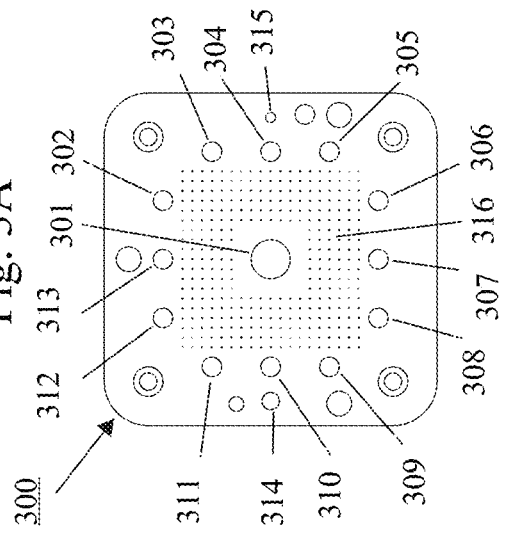
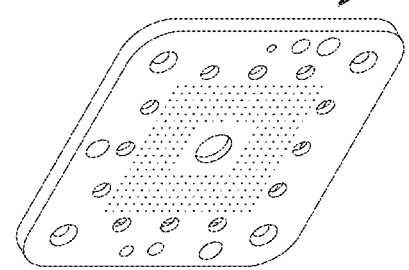

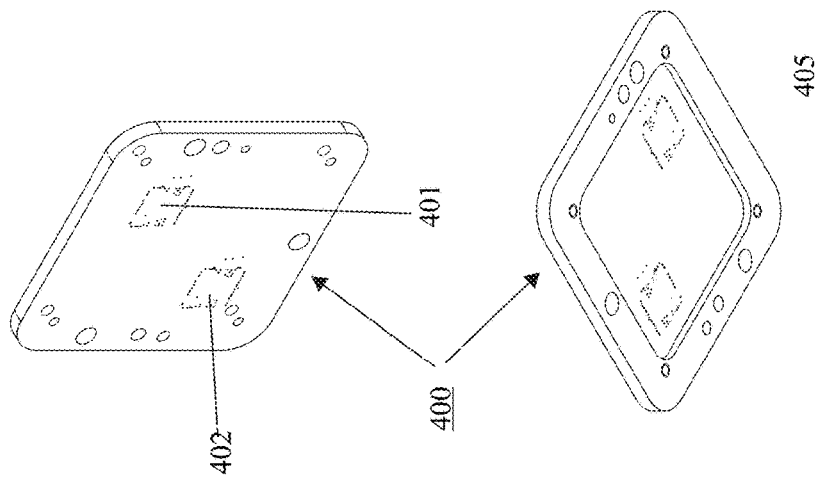
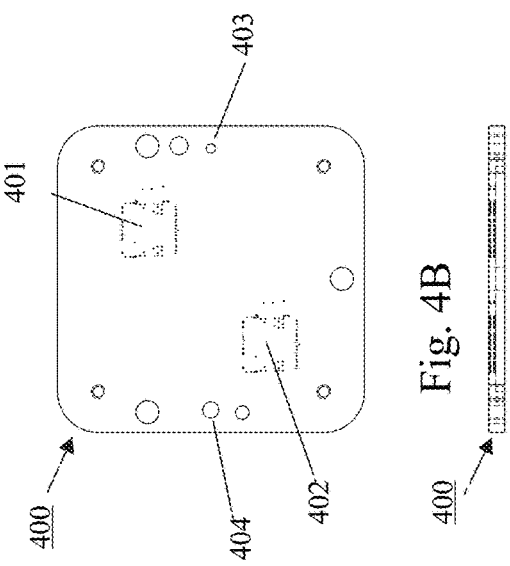
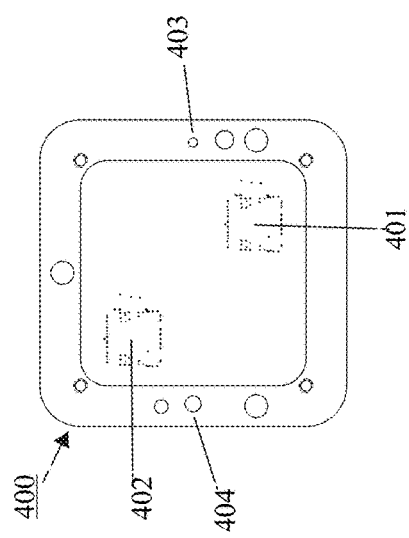

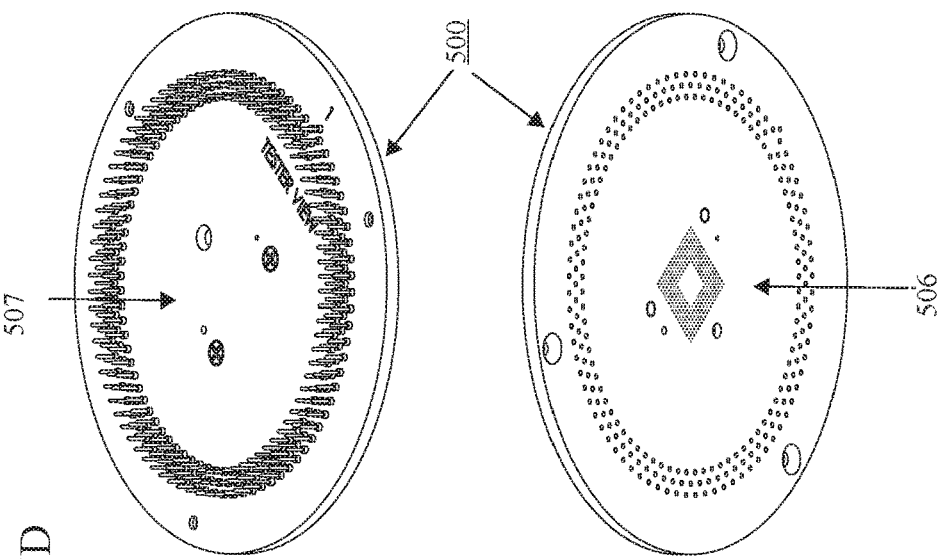
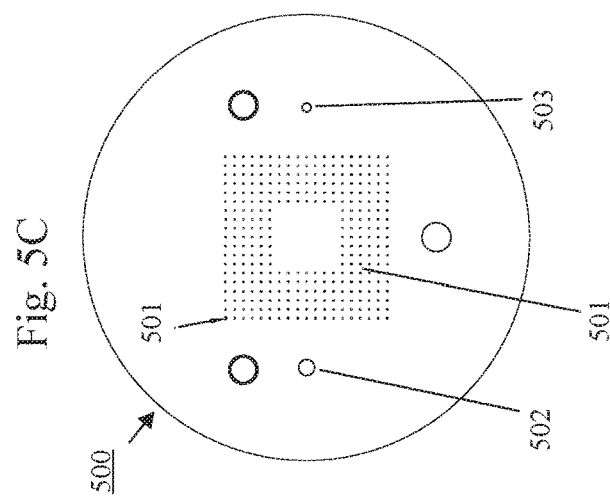
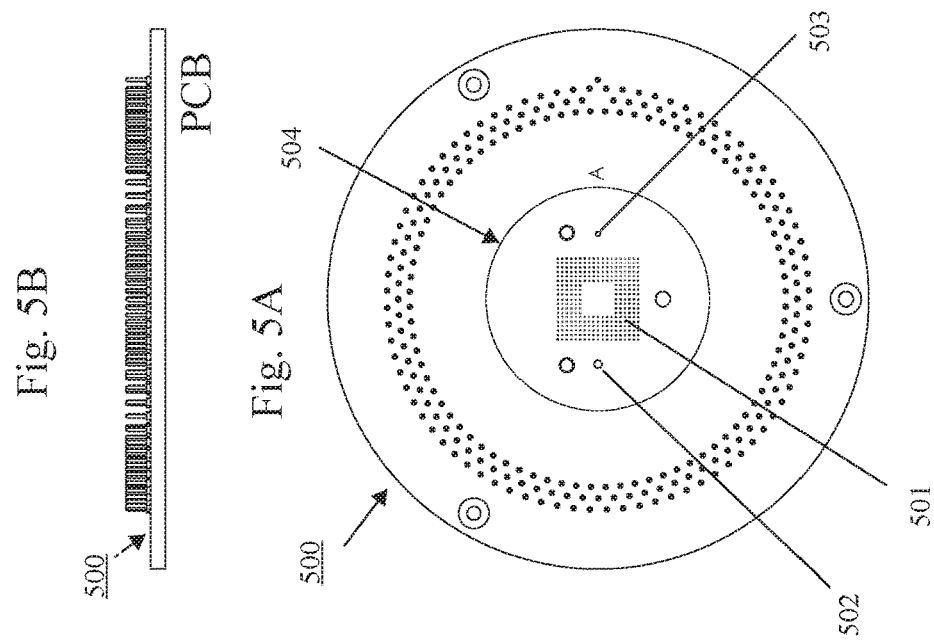

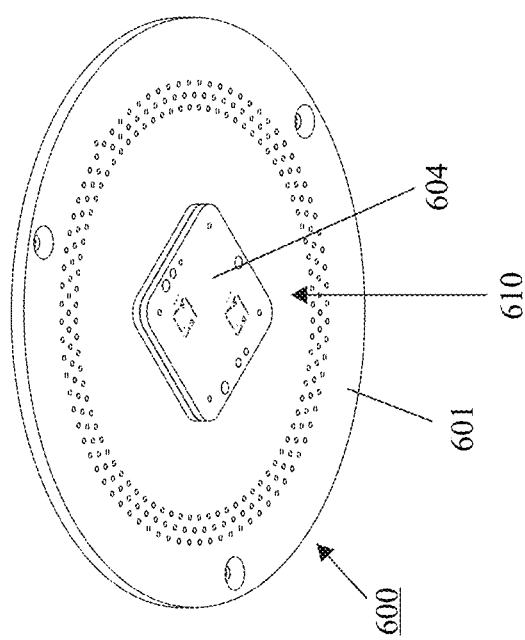
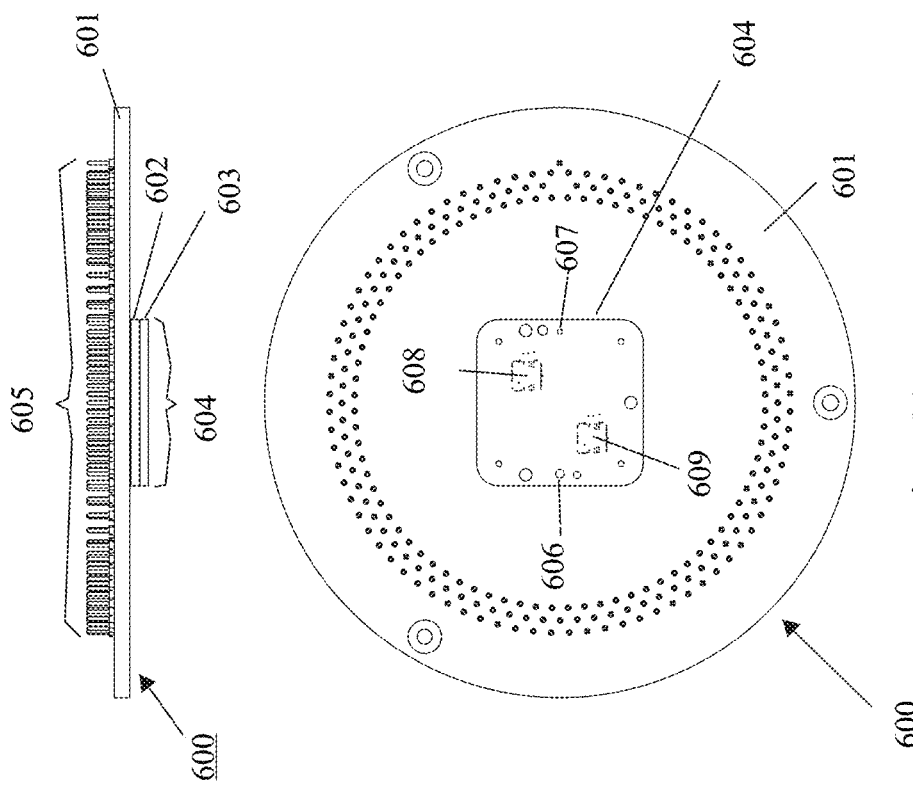

900

INTERFACE APPARATUS FOR SEMICONDUCTOR TESTING

CROSS REFERENCE TO RELATED APPLICATIONS

This application is a continuation-in-part application of U.S. patent application Ser. No. 15/980,748 titled "Interface Apparatus for Semiconductor Testing and Method of Manufacturing Same", filed May 16, 2018 which is a continuation-in-part of U.S. patent application Ser. No. 14/864,823 titled "Interface Apparatus for Semiconductor Testing and Method of Manufacturing Same", filed Sep. 24, 2015.

BACKGROUND

The present invention relates to an electrical/mechanical interface apparatus, and in particular, to interface apparatus for semiconductor testing and method of manufacturing same.

The pads on semiconductor devices are getting smaller. Traditional cantilever probes need to scrub the pad and with smaller areas, the scrub may extend into the die area potentially causing damage to the device.

An alternative solution is the vertical probe. However interfacing these vertical probe contactors to tester equipment has become more difficult as the pitch between device pads becomes less than 100 microns. Also, the vertical depth required for legacy test systems may limit the type of solutions which may be employed.

Thus, there is a need for interface apparatus for semiconductor testing and method of manufacturing same.

SUMMARY

Embodiments of the present invention include an interface assembly for a vertical probe contactor. The interface assembly includes a base board, a mounting board, a depth adjust plate between the base board and the mounting board, and an interface apparatus mounted to the mounting board. The interface apparatus is configured to receive the vertical probe contactor through an opening in the base board and a corresponding opening in the depth adjust plate. A thickness of the depth adjust plate defines a vertical distance between a wafer side of the base plate and a plurality of probe tips of the vertical probe contactor.

In one embodiment the interface assembly further includes a first plurality of conductive surfaces having a first pitch to interface to the mounting board, and a second plurality of conductive surfaces having a second pitch to interface to the vertical probe contactor. The first pitch is greater than the second pitch.

Embodiments of the present invention include a method. The method includes mounting, locating, and aligning. The mounting includes mounting an interface apparatus to a mounting board. The locating includes locating a depth adjustment plate against the mounting board such that the interface apparatus is exposed though an opening in the depth adjustment plate and a first surface of the depth adjustment plate is against a surface of the mounting board. The aligning includes aligning the mounting board to the base plate such that a second surface of the depth adjustment plate is against a surface of the base plate such that the interface apparatus is configured to receive a vertical probe contactor which has a plurality of probe tips which are aligned in all three dimensions.

Embodiments of the present invention include a system of interfacing a wafer with an automated tester. The system includes a vertical probe contactor and an interface assembly. The interface assembly includes a base board, a mounting board, a depth adjust plate between the base board and the mounting board, and an interface apparatus mounted to the mounting board. The interface apparatus is configured to receive the vertical probe contactor through an opening in the base board and a corresponding opening in the depth adjust plate. A thickness of the depth adjust plate defines a vertical distance between a wafer side of the base plate and a plurality of probe tips of the vertical probe contactor. The plurality of probe tips contact the wafer, and the base board couples to a plurality of instruments of the automated tester.

The following detailed description and accompanying drawings provide a better understanding of the nature and advantages of the present invention.

BRIEF DESCRIPTION OF THE DRAWINGS

FIG. 2 illustrates a method of manufacturing a interface apparatus according to another embodiment of the present invention.

FIGS. 3A-D illustrate an upper housing substrate according to yet another embodiment of the invention.

FIGS. 4A-D illustrate a lower housing substrate according to another embodiment of the invention.

FIGS. 5A-D illustrate a printed circuit board (PCB) configured to attach an interface apparatus according to yet another embodiment of the invention.

FIGS. 6A-C illustrate a system of interfacing a tester with a vertical probe contactor according to another embodiment of the invention.

DETAILED DESCRIPTION

Described herein are techniques for interface apparatus and method for manufacturing same. In the following description, for purposes of explanation, numerous examples and specific details are set forth in order to provide a thorough understanding of the present invention. It will be evident, however, to one skilled in the art that the present invention as defined by the claims may include some or all of the features in these examples alone or in combination with other features described below, and may further include modifications and equivalents of the features and concepts described herein.

Figure 1:
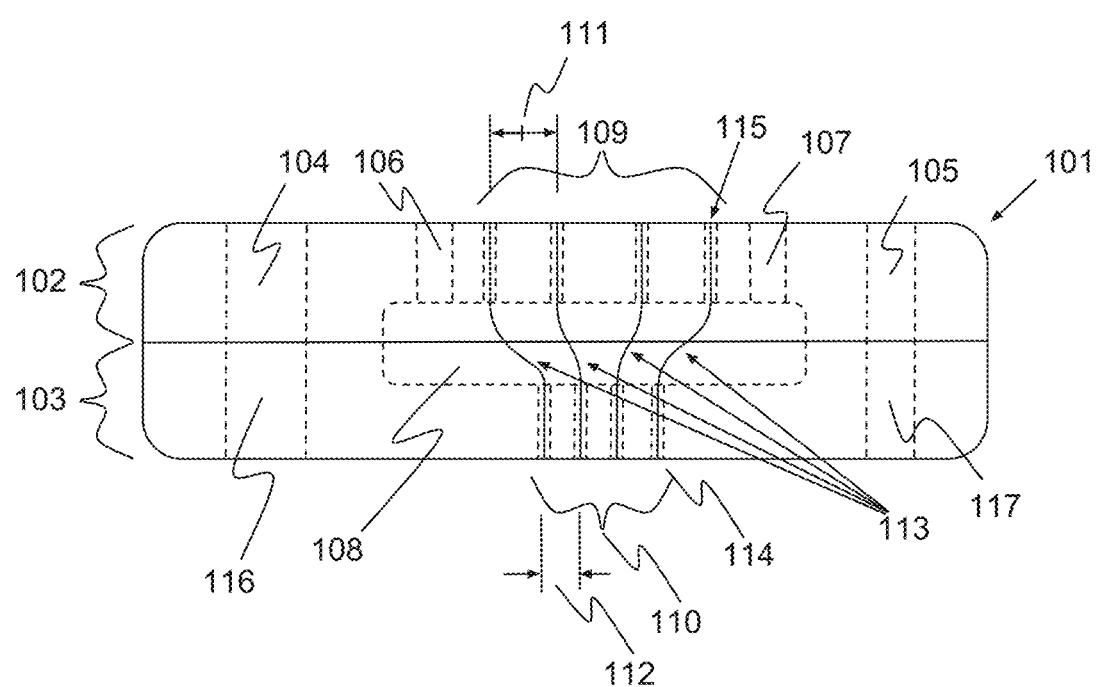
FIG. 1 illustrates an apparatus according to one embodiment of the present invention.

FIG. 1 illustrates an apparatus 100 according to one embodiment of the present invention. Apparatus 100 includes a housing 101 comprising an upper housing substrate 102, a lower housing substrate 103, and a plurality of wires 113 passing through plurality of apertures 109-110. Each wire has plated conductive ends emanating from opposing sides housing 101 (e.g. 114-115). Plurality of apertures 114 corresponds to plurality of apertures 115. For every aperture of the plurality of apertures 114, there is a corresponding aperture of plurality of apertures 115 which the same wire of the plurality of wires 113 are threaded through.

Plurality of apertures 109 has a pitch 111 and plurality of apertures 110 has a pitch of 112. Pitch 112 is less than pitch 111. In some embodiments pitch 112 may be less than or equal to 250 microns. In some embodiments pitch 111 may be greater than or equal to 300 microns. Apparatus 100 interfaces between a course pitch provided by plurality of apertures 109 and a fine pitch provided by plurality of apertures 110. This may allow a technology of greater than 250 micrometers capability to interface with another technology which has less than 100 micrometers capability. For example, a printed circuit board (PCB) (not shown) may have a pattern which may be interfaced to a vertical probe contactor.

Apparatus 100 also has an internal volume 108 which is recessed on both housing substrate 102-103. In another embodiment, only one of the housing substrates (i.e. housing substrate 102 or 103) may include a recessed portion to provide the internal volume. Holes 106-107 may be used to inject epoxy into the internal volume 108. In another embodiment, there may be a plurality of epoxy holes to aid in injecting an even flow of epoxy into internal volume 108. This plurality of epoxy holes may be arrayed along a periphery of the plurality of apertures 102 or 103 in order to provide a complete adhesion of the plurality of wires 113 within plurality of apertures 102-103.

Apparatus 100 also has alignment holes 104-105 and 116-117 that may be used to align housing substrate 102 to housing substrate 103 prior to attaching them with an epoxy injection as described above. Alignment holes 104-105 and 116-117 may also be used to align apparatus 100 to a PCB. For example, plurality of apertures 109 may be arranged in a ball grid array (BGA) pattern so that solder balls or a thick solder paste may be distributed on a conductive BGA pattern on a PCB, and the alignment holes 104-105 and 116-117 may be used to align apparatus 100 to a PCB so that heat may be applied and apparatus 100 may be soldered to the PCB. In one embodiment, the alignment holes 104-105, 116-117 may be used to align a contactor to the apparatus 100 and a PCB (i.e. mechanically interface a contactor to a PCB) and the plurality of apertures 109-110 may electrically interface between the contactor and the PCB.

The plated conductive ends (e.g. 114-115) may be all plated with the same material and with the same tolerance of thickness. This may be accomplished if all the wire ends are plated at the same time. For example, a lot of similar apparatus such as apparatus 100 may be plated together: first by bathing the lot in nickel; and then by bathing the lot in gold. In one embodiment, housing 101 is ceramic such that only the wire ends will adhere to the nickel and gold (respectively).

FIG. 2 illustrates a method of manufacturing 200 an interface apparatus according to another embodiment of the present invention.

At 201, drill a first plurality of apertures through a first housing substrate. The first plurality of apertures is arranged according to a first pitch.

At 202, drill a second plurality of apertures through a second housing substrate. The second plurality of apertures is arranged according to a second pitch.

At 203, align the first and second housing substrate to each other. This may be accomplished by having a fixture which has steal dowels which go through the alignment holes on the first and second housing.

At 204, place temporary spacers between the first and second housing substrates. This may be used to allow enough space to thread the plurality of wires into the respective pluralities of apertures found in the first and second housing substrates.

At, 205, pass a plurality of wires through the pluralities of apertures according to a correspondence between the first and second plurality of apertures.

At 206, attach the first and second housing substrates. This forms a single housing. The attaching may include injecting epoxy into an internal volume of the housing. The internal volume may be formed from a recessed portion in at least one of said first and second housing substrates.

At 207, cut the wire ends of the plurality of wires protruding out from the first and second housing substrates.

At 207, lap the wire ends.

At 208, plate the wire ends. The plating may include gold plating over an initial nickel plating. The plating may occur without masking and without a fixture. For example, in one embodiment, the housing may be made of ceramic such that the entire unit may be placed into a plating bath. This would insure that all the wire ends were plated with the same tolerance of thickness and the same material. This operation does not need masking because the plating material would not adhere to the ceramic portions of the unit.

FIGS. 3A-D illustrate an upper housing substrate 300 according to yet another embodiment of the invention. FIG. 3A illustrates a contact side of upper housing substrate 300 showing alignment holes 314-315, epoxy injection holes 301-313, and plurality of apertures 316. The plurality of apertures 316 is in a BGA pattern in this embodiment.

FIG. 3B illustrates a side view of upper housing substrate 300.

FIG. 3C illustrates an internal view of upper housing substrate 300 showing alignment holes 314-315 and plurality of apertures 316.

FIG. 3D illustrates two 3-dimensional views of upper housing substrate 300. Upper housing substrate 300 includes a recessed portion 317 in which a plurality of wires and an epoxy may reside.

FIGS. 4A-D illustrate a lower housing substrate 400 according to another embodiment of the invention. FIG. 4A illustrates a contact side of lower housing substrate 400 showing plurality of apertures 401-402 and alignment holes 403-404.

FIG. 4B illustrates a side view of upper housing substrate 400.

FIG. 4C illustrates an internal view of lower housing substrate 400 showing plurality of apertures 401-402 and alignment holes 403-404.

FIG. 4D illustrates two 3-dimensional views of lower housing substrate 400. Lower housing substrate 400 includes plurality of apertures 401-402 and a recessed portion 405 in which a plurality of wires and an epoxy may reside.

FIGS. 5A-D illustrate a printed circuit board 500 (PCB) configured to attach an interface apparatus according to yet another embodiment of the invention. FIG. 5A illustrates a contact side of PCB 500 showing alignment holes 502-503 and a plurality of conductive pads 501. Area 504 shows the contact area where an interface apparatus may be attached.

FIG. 5B illustrates a side view of PCB 500. PCB 500 includes a plurality of pins to interface to a test plate. PCB 500 may be a daughter board configured as a contactor interface board. In one embodiment, PCB 500 may be a general interface board which may be used on a family of test plates in order to quickly replace the vertical probes on a test system.

FIG. 5C illustrates a detail of area 504 of FIG. 5A showing alignment holes 502-503 and conductive pads 501. In one embodiment, conductive pads 501 may have a solder mask. In another embodiment, the plurality of conductive pads 501 may be arranged in a BGA pattern and bumped with solder balls (e.g. solder ball 505). The plurality of conductive pads 501 may have positions to couple with a plurality of wires positioned within a plurality of apertures also arranged in the same BGA pattern.

FIG. 5D illustrates two 3-dimensional views of PCB 500. Contactor side 506 may be where an interface apparatus may be attached. PCB 500 may be attached to a tester though a test plate from the tester side 507 side.

FIGS. 6A-C illustrate a system 600 of interfacing a tester with a vertical probe contactor according to another embodiment of the invention. FIG. 6A illustrates a contactor side of system 600 showing interface apparatus 604 attached to PCB 601. Interface apparatus 604 includes a plurality of conductive ends 608-609 and alignment holes 606-607. System 600 is a dual site interface system designed to contact 2 die simultaneously. Other configurations of multisite arrangements are also possible in other embodiments. Alignment holes 606-607 may be used to align a contactor to interface apparatus 604.

FIG. 6B illustrates a side view of system 600. FIG. 6B shows PCB 601 having a plurality of pins 605 on the tester side of system 600 and an interface apparatus 604 attached on the contactor side of system 600. Interface apparatus 604 includes an upper housing substrate 602 and a lower housing substrate 603.

FIG. 6C illustrates a 3-dimensional view of system 600. FIG. 6C shows the contactor side 610 of system 600. Interface apparatus 604 is shown attached to PCB 601. In other embodiments, interface apparatus 604 may be attached directly to a test plate which interfaces to a tester. In another embodiment, interface apparatus 604 may be attached to a swap block which couples to test instruments through a pogo tower and general interface PCB.

Figure 7:
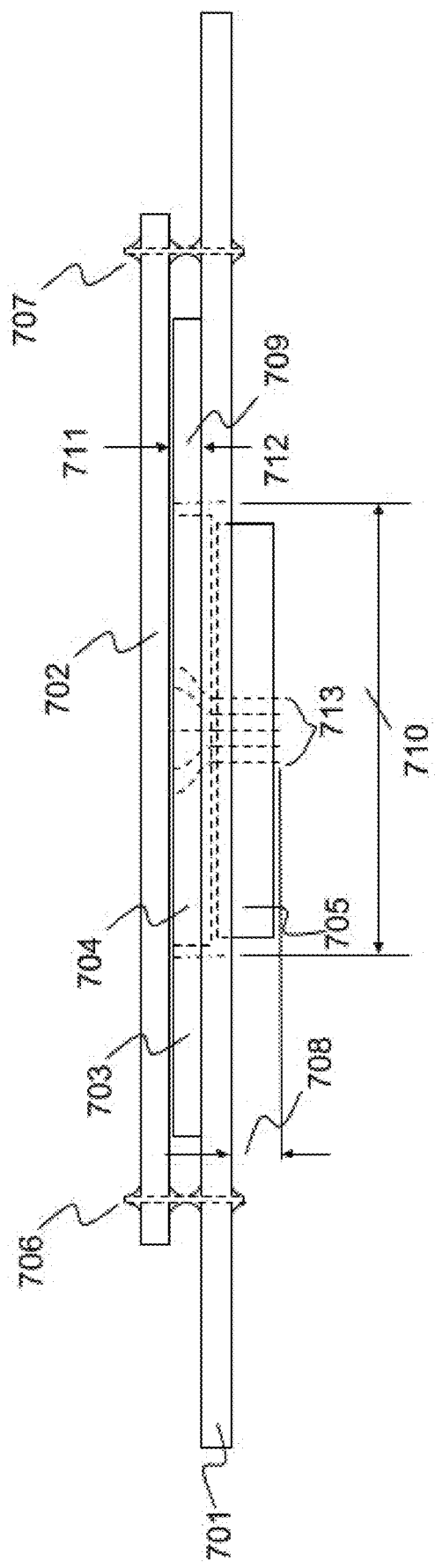
FIG. 7 illustrates an interface assembly according to one embodiment of the present invention.

FIG. 7 illustrates an interface assembly 700 according to one embodiment of the present invention. Interface assembly 700 includes base board 701, mounting board 702, depth adjust plate 703, and interface apparatus 704. Depth adjust plate 703 is located between base board 701 and mounting board 702. Interface apparatus 704 is mounted to mounting board 702. Interface apparatus is exposed though an opening 710 in depth adjustment plate 703 and surface 711 of said depth adjustment plate 709 is against a surface of the mounting board. Mounting board 702 is aligned to base plate 701 such that surface 712 of depth adjustment plate 703 is against a surface of said base plate 701. The aligning configures interface apparatus 704 to receive a vertical probe contactor 705 which has a plurality of probe tips 713 which are consequently aligned in all three dimensions.

In a system vertical probe contactor 705 is attached to interface apparatus 704. Interface apparatus 704 is configured to receive vertical probe contactor 705 through opening 710 in base board 701 and depth adjust plate 703. Thickness 709 of depth adjust plate 703 defines a vertical distance 708 between a wafer site of base plate 701 and plurality of probe tips 713.

Plurality of probe tips 713 may be electrically coupled to base board 701 through interface apparatus 704 and mounting board 702. Plurality of pins (depicted as 706-707) couples traces on mounting board 702 to traces on base board 701. In one embodiment, mounting board 702 may be a PCB (Printed Circuit Board) having several layers of conductive traces and components on the exposed (non-wafer) side. Interface apparatus 704 electrically couples mounting board 702 to vertical probe contactor 705.

In one embodiment, interface apparatus 704 includes a first plurality of conductive surfaces having a first pitch to interface to mounting board 702 and a second plurality of conductive surfaces having a second pitch to interface to vertical probe contactor 705. The first pitch is greater than the second pitch.

In another embodiment, the material of depth adjustment plate 703 and the housing of interface apparatus 704 have similar coefficient of thermal expansion (CTE) such that interface assembly 700 remains stable. For example, depth adjustment plate 703 and interface apparatus 704 may be made of ceramic material.

In an alternate embodiment there may be voids in interface apparatus 704 which would allow components on the unexposed side of mounting board 702. In yet another embodiment, interface apparatus 704 may accommodate components within an internal volume.

Interface assembly 700 may be used in a system. The system may interface an automated tester (ATE) to a semiconductor wafer. Plurality of probe tips 713 contact the wafer, and base board 701 couples to a plurality of instruments of the automated tester. The base board allows for flexibility in the test solutions to provide and reconfigure an application of the ATE instruments. Mounting board 702 may provide moderate precision in contacting and translating the electrical instrument from the base board 701 to interface apparatus 704. This moderate precision may allow for less stringent requirement on mounting board 702 manufacturing. Interface apparatus 704 may allow for these connections to be redistributed into a finer pitch suitable for vertical probe contactor 705. The vertical probe contactor 705 may allow for multi-die testing with a very tight pitch. This may in turn, provide for parallel testing; Parallel testing increases ATE utilization through higher throughput.

Figure 8:
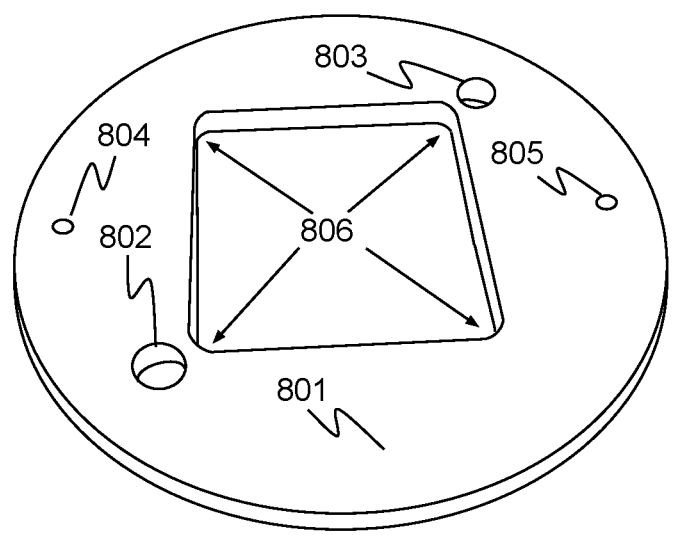
FIG. 8 illustrates depth adjustment plate according to one embodiment of the invention.

FIG. 8 illustrates depth adjustment plate 800 according to one embodiment of the invention. Depth adjustment plate includes opening 806 which allows for a contactor and/or interface apparatus to sit inside. Holes 802-803 may be used to allow attachment screws to sandwich depth adjustment plate between a base plate and mounting board. Alignment holes 804-805 may be used to situate depth adjustment plate 800 side 801 on top of a base plate.

Figure 9:
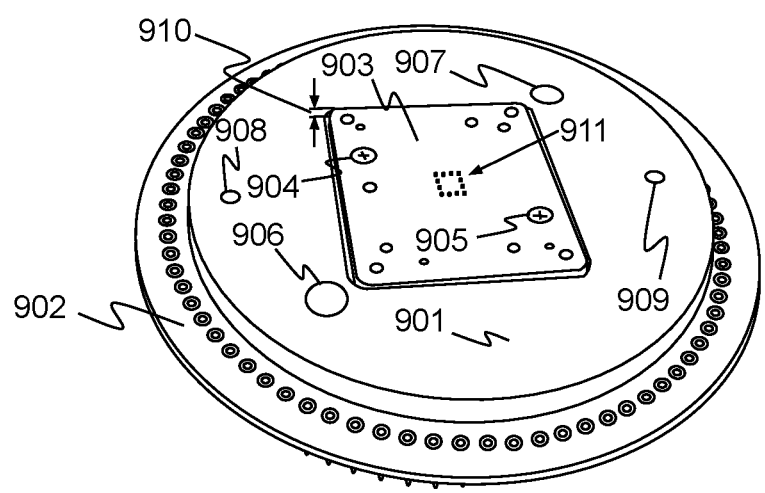
FIG. 9 illustrates a general placement of depth adjustment plate on top of a mounting board.

FIG. 9 illustrates a general placement 900 of depth adjustment plate 901 on top of mounting board 902. In this illustration, interface apparatus 903 is attached to base plate 902 with screws 904-905. Interface apparatus includes a plurality of conductive surfaces 911 which is configured to mate to a vertical probe contactor. Depth adjustment plate 901 has holes 906-909 which correspond to holes 802-805 of FIG. 8. Depth adjustment plate 901 sits a distance 910 below interface apparatus 903.

Figure 10A:
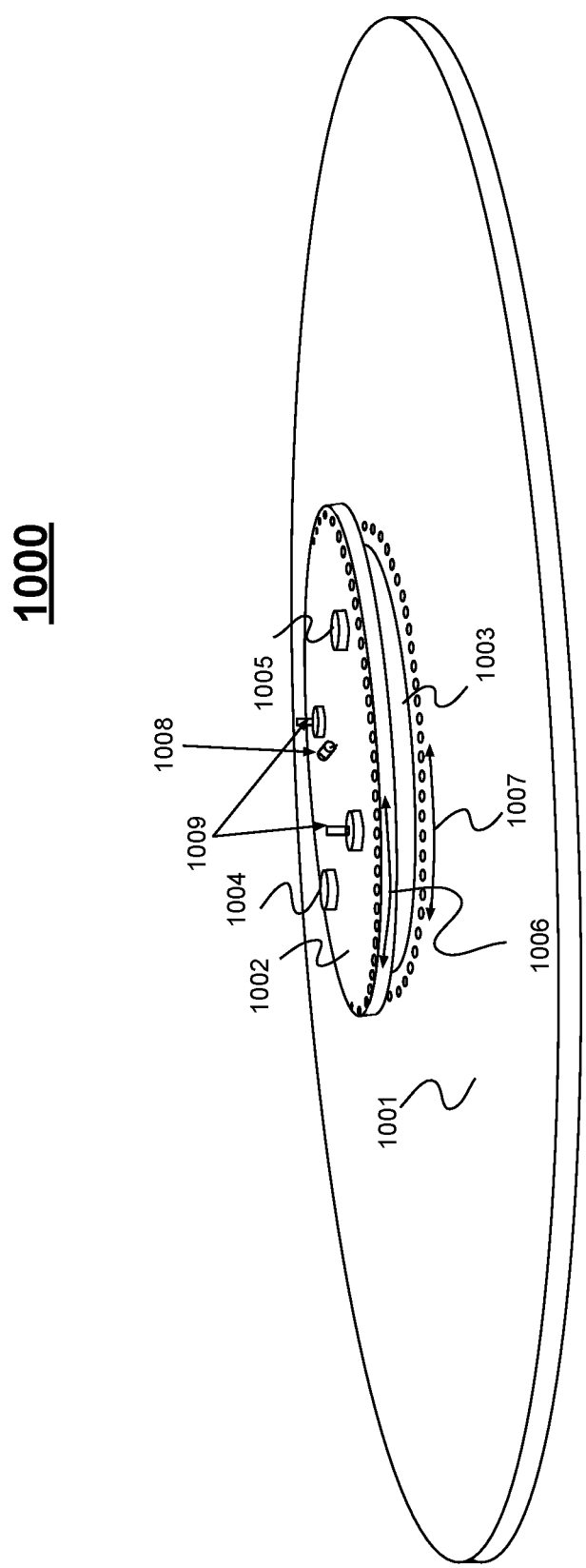
FIGS. 10A-C illustrate an interface assembly according to another embodiment of the invention.
Figure 10B:
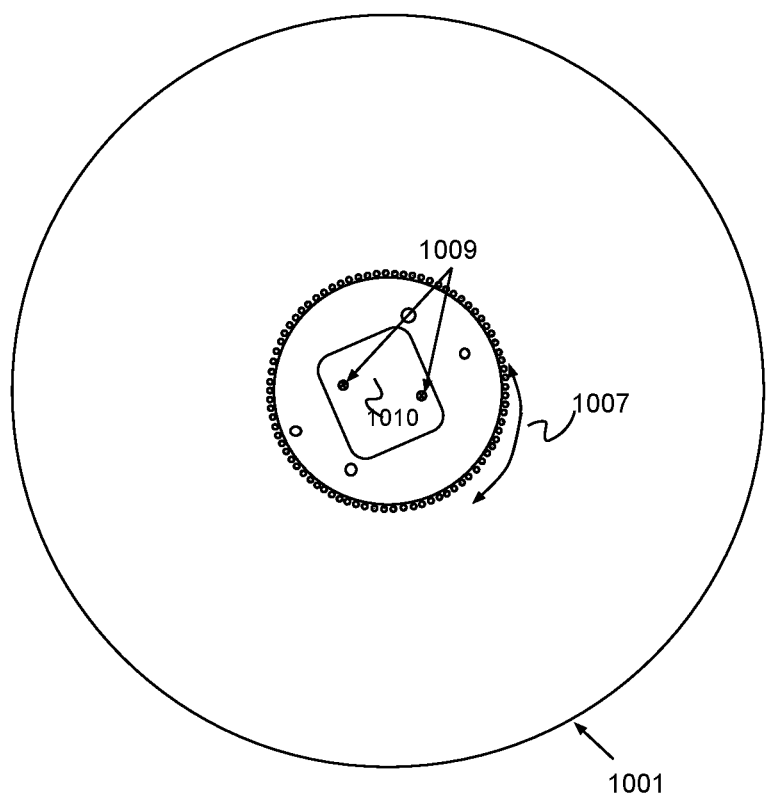
Figure 10C:
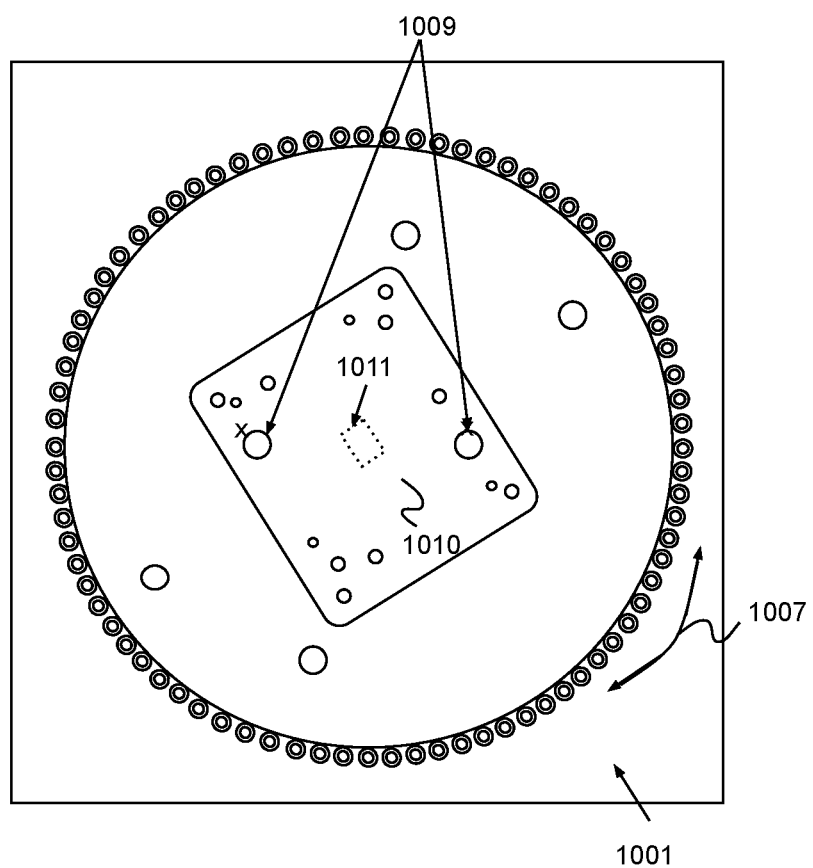

FIGS. 10A-C illustrate an interface assembly 1000 according to another embodiment of the invention. FIG. 10A illustrates and angled view of the top of interface assembly 1000. Interface assembly 1000 includes base board 1001, mounting board 1002, and depth adjustment plate 1003. Mounting board 1002 includes pem nuts 1004-1005 which correspond to holes 802-803 of FIG. 8. Screws 1009 may be used to secure interface apparatus 1010 (not shown in FIG. 10A). A ring of plurality of pin holes 1007 in base plate 1001 correspond to a ring of plurality if pin holes 1006 in mounting board 1002. A completed assembly may include pins coupling plurality if pin holes 1006 to plurality of pin holes 1007. Mounting board 1002 has components 1008 attached to the exposed side (i.e. non-wafer side). Components 1008 may be bypass capacitor or any other circuitry which may be necessary to have proximate with the device under test (DUT).

FIG. 10B illustrates a wafer side view of interface assembly 1000. Screws 1009 are shown attaching interface apparatus 1010 to mounting board 1002 (not shown in FIG. 10B). Base plate 1001 shows the ring of plurality of pin holes 1007 surrounding an opening in base plate 1001. The ring of plurality of pin holes 1007 may have been used for a legacy cantilever test solution. In way a legacy base plate (e.g. test plate) may be modified or remanufactured keeping all the test circuits intact and allowing the legacy test plate design to be retrofitted into an interface assembly like interface assembly 1000.

FIG. 10C illustrates a detail of interface assembly 1000. Screws 1009 and plurality of pin holes 1007 are indicated as reference. Plurality of conductive surfaces 1011 are shown on interface apparatus 1010. Interface apparatus 1010 is configured to receive a vertical probe contactor.

The above description illustrates various embodiments of the present invention along with examples of how aspects of the present invention may be implemented. The above examples and embodiments should not be deemed to be the only embodiments, and are presented to illustrate the flexibility and advantages of the present invention. Based on the above disclosure, other arrangements, embodiments, implementations and equivalents will be evident to those skilled in the art and may be employed without departing from the spirit and scope of the invention.

What is claimed is:

1. An interface assembly for a vertical probe contactor, said interface assembly comprising:
   a base board;
   a mounting board;
   a depth adjust plate between said base board and said mounting board; and
   an interface apparatus mounted to said mounting board, said interface apparatus configured to receive said vertical probe contactor through an opening in said base board and a corresponding opening in said depth adjust plate,
   wherein a thickness of said depth adjust plate defines a vertical distance between a wafer side of said base board and a plurality of probe tips of said vertical probe contactor.

2. The assembly of claim 1 wherein a plurality of probe tips of said vertical probe contactor is electrically coupled to said base board through said interface apparatus and said mounting board.

3. The assembly of claim 1 wherein said mounting board includes at least one component coupled to at least one probe tip of said plurality of probe tips.

4. The assembly of claim 1 wherein a material of said depth adjustment plate and said interface apparatus has a similar coefficient of thermal expansion (CTE).

5. The assembly of claim 4 wherein said material of said depth adjustment plate and said interface apparatus is ceramic.

6. The assembly of claim 1 further comprising a plurality of pins coupling traces on said mounting board to traces on said base board.

7. The assembly of claim 1 wherein said interface apparatus includes:
   a first plurality of conductive surfaces having a first pitch to interface to said mounting board; and
   a second plurality of conductive surfaces having a second pitch to interface to said vertical probe contactor,
   wherein said first pitch is greater than said second pitch.

8. A method comprising:
   mounting an interface apparatus to a mounting board;
   locating a depth adjustment plate against said mounting board such that said interface apparatus is exposed though an opening in said depth adjustment plate and a first surface of said depth adjustment plate is against a surface of said mounting board; and
   aligning said mounting board to a base board such that a second surface of said depth adjustment plate is against a surface of said base board such that said interface apparatus is configured to receive a vertical probe contactor which has a plurality of probe tips which are aligned in all three dimensions.

9. The method of claim 8 further comprising electrically coupling said plurality of probe tips to said base board through said interface apparatus and said mounting board.

10. The method of claim 8 further comprising coupling at least one component attached to said mounting board to at least one probe tip of said plurality of probe tips.

11. The method of claim 8 further comprising coupling traces on said mounting board to traces on said base board.

12. The method of claim 8 further comprising:
   interfacing said interface apparatus to said mounting board with a first plurality of conductive surfaces having a first pitch; and
   interfacing said interface apparatus to said vertical probe contactor with a second plurality of conductive surfaces having a second pitch.

13. A system of interfacing a wafer with an automated tester, said system comprising:
   a vertical probe contactor; and
   an interface assembly comprising,
      a base board,
      a mounting board,
      a depth adjust plate between said base board and said mounting board, and
      an interface apparatus mounted to said mounting board, said interface apparatus configured to receive said vertical probe contactor through an opening in said base board and a corresponding opening in said depth adjust plate,
   wherein a thickness of said depth adjust plate defines a vertical distance between a wafer side of said base board and a plurality of probe tips of said vertical probe contactor,
wherein said plurality of probe tips contact said wafer, and wherein said base board couples to a plurality of instruments of said automated tester.

14. The system of claim 13 wherein a plurality of probe tips of said vertical probe contactor are electrically coupled to said base board through said interface apparatus and said mounting board.

15. The system of claim 13 wherein said mounting board includes at least one component coupled to at least one probe tip of said plurality of probe tips.

16. The system of claim 13 wherein a material of said depth adjustment plate and said interface apparatus have a similar coefficient of thermal expansion (CTE).

17. The system of claim 13 further comprising a plurality of pins coupling traces on said mounting board to traces on said base board.

18. The system of claim 13 wherein said interface apparatus includes:
   a first plurality of conductive surfaces having a first pitch to interface to said mounting board; and
   a second plurality of conductive surfaces having a second pitch to interface to said vertical probe contactor,
wherein said first pitch is greater than said second pitch.

* * * * *